(12) United States Patent
Mizutani

(10) Patent No.: US 6,408,425 B1
(45) Date of Patent: Jun. 18, 2002

(54) METHOD OF DESIGNING CIRCUIT WITH FIELD EFFECT TRANSISTOR AND METHOD OF DETERMINING PARAMETERS OF MODEL USED IN SUCH DESIGNING METHOD

(75) Inventor: Hiroshi Mizutani, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/405,690

(22) Filed: Sep. 24, 1999

(30) Foreign Application Priority Data

Sep. 25, 1998 (JP) ............................................. 10-271429

(51) Int. Cl.[7] .............................................. G06F 17/50
(52) U.S. Cl. ........................................................... 716/5
(58) Field of Search ................... 716/5, 11, 1

(56) References Cited

U.S. PATENT DOCUMENTS 5,467,291 A * 11/1995 Fan ............................ 364/578

* cited by examiner

Primary Examiner—Matthew Smith
Assistant Examiner—Tuan Do
(74) Attorney, Agent, or Firm—Hutchins, Wheeler & Dittmar

(57) ABSTRACT

A method of designing a circuit with a field effect transistor (FET) for operation with a large signal. The method comprises the steps of expressing the FET with a two-terminal nonlinear circuit model having a source and a drain, such that a gate terminal thereof is open in at least a frequency band used thereby, and calculating behaviors of the circuit in operation with a large signal represented by a large amplitude of an input voltage, based on the two-terminal nonlinear circuit model.

13 Claims, 7 Drawing Sheets

OPEN CHANNEL STATE

PINCH OFF STATE

METHOD OF DESIGNING CIRCUIT WITH FIELD EFFECT TRANSISTOR AND METHOD OF DETERMINING PARAMETERS OF MODEL USED IN SUCH DESIGNING METHOD

BACKGROUND OF THE INVENTION

1. Field of the Invention

The present invention relates to a method of designing a circuit with a field effect transistor (FET), and more particularly to a method of designing an FET circuit for operation with a large signal and a method of determining parameters of a model used in such a method of designing an FET circuit.

2. Description of the Prior Art

Generally, a device model of an FET is used for designing a circuit with an FET. Different device models are used depending on whether the circuit with the FET is to operate with a small signal or a large signal. The large signal refers to an input signal having a large amplitude, determined by the impedance of the circuit with the FET. For example, an input voltage with an input power of 20 dBm is a large signal. The small signal refers to an input signal having a small amplitude. For example, an input voltage with an input power of −20 dBm is a small signal.

If a small signal is inputted to the circuit with the FET, then since the amplitude of the input voltage is small and the voltage varies in a very small range, parameters representing the FET can be handled as being constant, and an output current can be approximated as varying according a linear function of the input voltage. Consequently, the FET can be regarded as a linear circuit when it is operated with the small signal.

If a large signal is inputted to the circuit with the FET, then since the amplitude of the input voltage is large, parameters representing the FET depend on the input voltage, and an output current cannot be handled as a linear function of the input voltage. Therefore, the FET can be regarded as a nonlinear circuit when it is operated with the small signal.

As shown in FIG. 1, FET 1 has three terminals, i.e., source S, drain D, and gate G. An equivalent circuit of FET 1 can be expressed as a three-terminal circuit as shown in FIG. 2 of the accompanying drawings, as disclosed in H. Statz et al., IEEE Transaction On Electron Devices, ED-34, pp. 160–169, February 1987. A similar model is also disclosed in W. R. Curtice, IEEE Transaction on Microwave Theory and Techniques, MTT-33, pp. 1383–1394, December 1985.

If a three-terminal FET is expressed as a three-terminal nonlinear FET, then it has up to 32 device parameters, as is the case with the model of H. Statz et al., as shown in Table 1 below.

TABLE 1

| Name | Meaning |
| --- | --- |
| β | Transconductance parameter |
| VTO | Threshold voltage |
| α | Current saturation parameter |
| λ | Output conductance parameter |
| θ | Statz's b parameter |
| τ | Transit time under gate |
| VBR | Gate-drain junction reverse bias breakdown voltage |
| IS | Gate junction reverse saturation current |

TABLE 1-continued

| Name | Meaning |
| --- | --- |
| N | Gate junction ideality factor |
| VBI | Built-in gate potential |
| FC | Coefficient for forward bias depletion capacitance |
| RC | Frequency dependent parameter of output conductance |
| CRF | Frequency dependent parameter of output conductance |
| RD | Drain ohmic resistance |
| RG | Gate resistance |
| RS | Source ohmic resistance |
| RIN | Channel resistance |
| CGSO | Zero bias gate-source junction capacitance |
| CGDO | Zero bias gate-drain junction capacitance |
| δ1 | Capacitance saturation transition voltage parameter |
| δ2 | Capacitance threshold transition voltage parameter |
| CDS | Drain-source capacitance |
| CGS | Gate-source capacitance |
| CGD | Gate-drain capacitance |
| KF | Flicker noise coefficient |
| AF | Flicker noise exponent |
| TNOM | Nominal ambient temperature at which the model parameters were derived |
| XTI | Temperature exponent for saturation current |
| EG | Energy gap |
| VTOTC | VTO temperature exponent |
| BETATCE | Drain current temperature coefficient |
| FFE | Flicker noise frequency exponent |

If an operation status when a large signal is inputted (operation with a large signal) is expressed by an FET circuit using the three-terminal nonlinear FET model by H. Statz et al., then it is necessary to somehow determine the 32 parameters. Heretofore, it has been customary to determine these parameters with a large expenditure of time and labor.

As described above, in the conventional process of designing an FET circuit, it is necessary to determine many parameters, e.g., 32 parameters, in order to express a nonlinear FET model as a three-terminal circuit model.

Therefore, a large expenditure of time and labor is required to design an FET circuit. Furthermore, the parameters thus determined of the nonlinear FET model are often not satisfactory enough to be able to fully express the actual operation of the FET circuit. To avoid such a drawback, many circuit designers develop their own nonlinear FET models.

There is a switch circuit which has a gate bias circuit designed such that a gate terminal can be seen as being open from an FET in a given frequency band, with only a DC bias being applied to the gate terminal. In such a switch circuit, the FET as it is considered in the given frequency band can be treated as a two-terminal model. For example, a circuit shown in FIG. 3A has isolation resistor 4 having a sufficiently large resistance and connected to gate G of an FET. If the FET with isolation resistor 4 connected thereto is operated as a switch circuit, then the FET can be treated as a two-terminal model. Since no DC bias is usually applied between the drain and source of the FET, the FET as it operates with a small input signal is represented by a very simple equivalent circuit. For example, when the FET is in an open-channel state, it can be expressed as simple resistor 7 as shown in FIG. 3B, and when the FET is in a pinch-off state, it can be expressed as simple capacitance 5 as shown in FIG. 3C.

A designing process for expressing such a small-signal equivalent circuit with simple resistor 7 and simple capacitance 5 is disclosed in M. J. Schindler et al., IEEE Transaction on Microwave Theory and Techniques, MTT-35, pp. 1486–1493, December 1987.

If a small-signal equivalent circuit is expressed as a simple two-terminal circuit, i.e., a two-terminal model, then the number of device parameters to be determined for such a two-terminal model is not so large as for the three-terminal model described above. Therefore, the time required to determine the device parameters is shorter, and so is the time required for designing a circuit with an FET. However, it has never been attempted to apply a two-terminal model to the designing of a circuit that is intended to be operated with a large signal. Particularly, a two-terminal nonlinear FET model required to design a large-signal circuit has not been available in the past.

SUMMARY OF THE INVENTION

It is an object of the present invention to provide a method of designing a circuit to achieve a high level of calculation accuracy with a relatively small number of parameters for a large-signal circuit.

Another object of the present invention is to provide a method of determining parameters for a two-terminal model to achieve a high level of calculation accuracy with a relatively small number of parameters for a large-signal simulation.

According to an aspect of the present invention, there is provided a method of designing a circuit with an FET (field effect transistor), comprising the steps of expressing the FET with a two-terminal nonlinear circuit model having a source and a drain, such that a gate terminal thereof is open in at least a frequency band used thereby, and calculating behaviors of the circuit in operation with a large signal represented by a large amplitude of an input voltage, based on the two-terminal nonlinear circuit model.

The two-terminal nonlinear circuit model may be a two-terminal circuit model having a current source whose current varies depending on a voltage and a source-drain capacitance connected parallel to the current source. Alternatively, the two-terminal nonlinear circuit model may be a circuit having a current source whose current varies depending on a voltage and a source-drain capacitance connected parallel to the current source when the FET is in a pinch-off state, and a circuit having only the current source when the FET is in an open-channel state.

According to another aspect of the present invention, there is also provided a method of determining parameters of such a two-terminal nonlinear circuit model. Specifically, if the two-terminal nonlinear circuit model comprises a two-terminal circuit model having a current source whose current varies depending on a voltage and a source-drain capacitance connected parallel to the current source, then drain currents and gate currents when the FET is in an open-channel state and a pinch-off state are expressed with equations using a function of a source-drain voltage or a predetermined function depending on a range of the source-drain voltage, and parameters of the equations are determined based on measured values. Specifically, parameters related to the source-drain capacitance are independently determined by fitting small signal parameters measured in operation with a small signal represented by a small amplitude of an input voltage which is determined by an impedance and an input voltage of a circuit with the FET, and parameters related to the current source are independently determined by fitting measured values of current-voltage characteristics of the FET.

With the arrangement of the present invention, since a nonlinear FET model which has heretofore been expressed by a three-terminal nonlinear circuit model can be expressed by a two-terminal nonlinear circuit model, the number of parameters, which have heretofore been 32 with the three-terminal nonlinear circuit model, can be reduced to 9, for example. A value of capacitance, which is one of the parameters, can substantially uniquely be determined using measured small signal parameters or data of a prototype switch circuit. The other remaining 8 parameters are parameters related to the current source, and can be determined independently of the capacitance by fitting current-voltage characteristics of the FET.

According to the present invention, therefore, it is much easier to determine parameters than possible with a three-terminal FET model, and a high level of calculation accuracy can be achieved for a large-signal simulation regardless of a relatively small number of parameters, i.e., 9 parameters. Consequently, a large-signal circuit can be designed with high accuracy using a two-terminal FET model.

The above and other objects, features, and advantages of the present invention will become apparent from the following description with reference to the accompanying drawings which illustrate examples of the present invention.

DESCRIPTION OF THE PREFERRED EMBODIMENTS

According to the present invention, an FET (field effect transistor) is expressed as a nonlinear circuit model having two terminals, i.e., a source and a drain, and arranged such that a gate terminal thereof is seen as being open in at least a frequency band in which the FET is used, and device parameters of the two-terminal nonlinear circuit model as it is operated with a large signal are determined. Then, a large-signal circuit is designed using the device parameters thus determined. In designing the circuit, it is possible to achieve a high level of calculation accuracy with a relatively small number of parameters.

Specific embodiments of the present invention will be described below.

Figure 1:
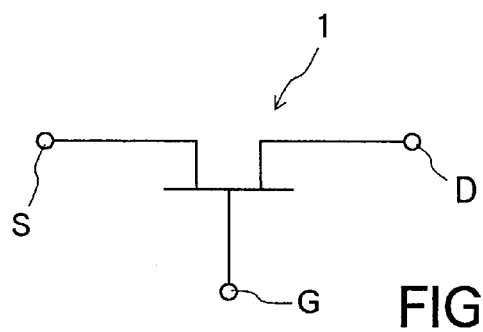
FIG. 1 is a diagram illustrating an FET (field effect transistor)
Figure 2:
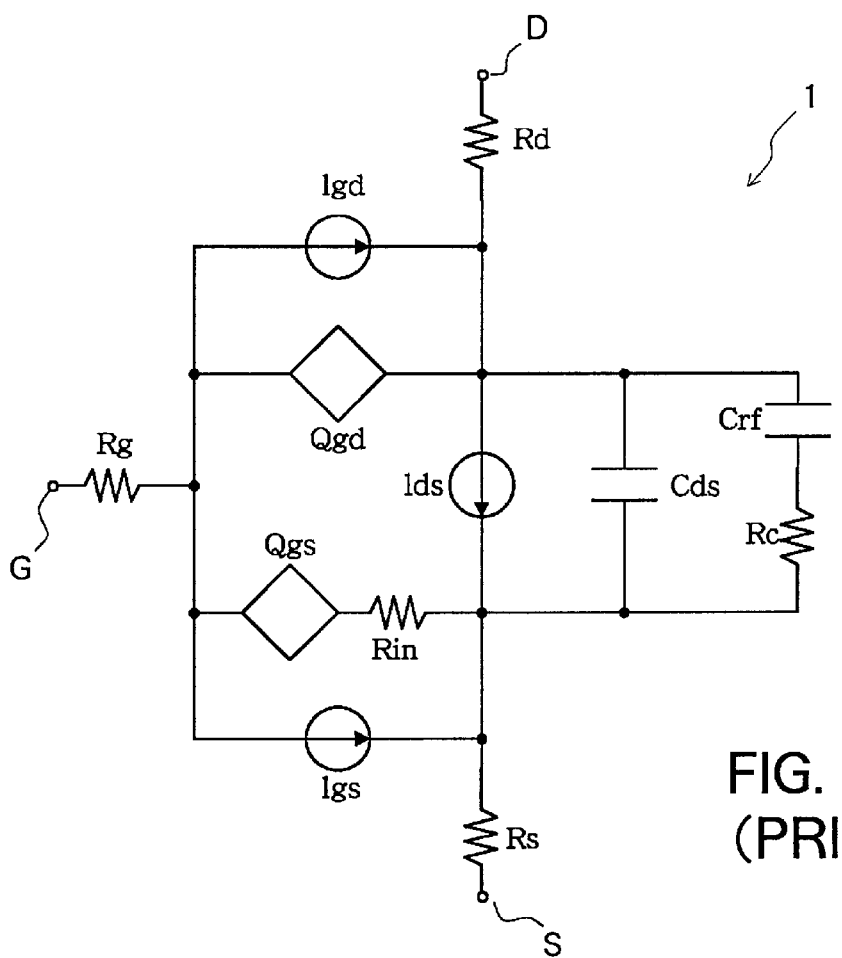
FIG. 2 is a circuit diagram of an equivalent circuit of a conventional three-terminal nonlinear FET model.
Figure 3A:
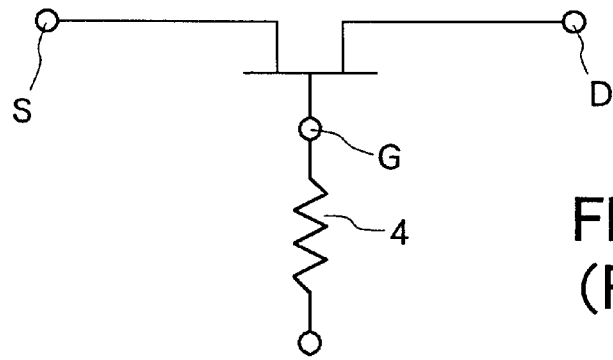
FIG. 3A is a circuit diagram of an FET with an isolation resistor connected thereto.
Figure 3B:
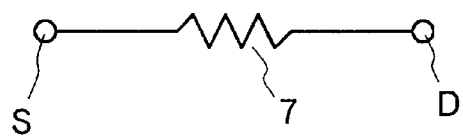
FIG. 3B is a circuit diagram of an equivalent circuit of a two-terminal FET model in an open-channel state while being operated with a small signal.
Figure 4:
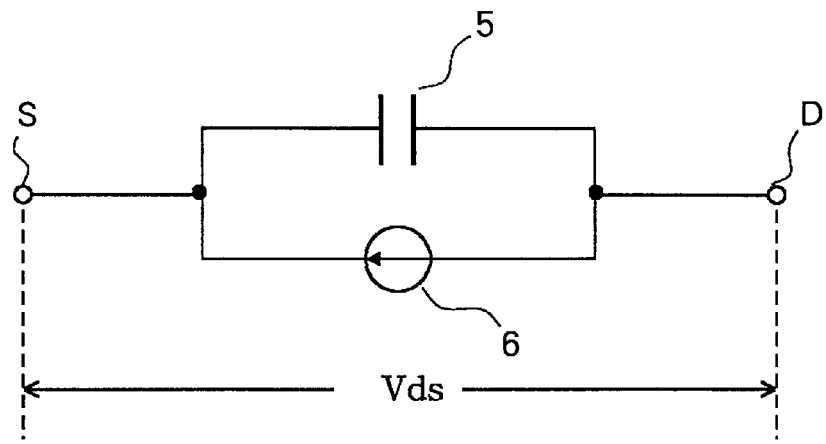
FIG. 4 is a circuit diagram of an equivalent circuit of a two-terminal nonlinear PET model according to a first embodiment of the present invention.

FIG. 4 shows a two-terminal nonlinear FET model according to a first embodiment of the present invention. In the first embodiment, it is assumed that isolation resistor 4 is connected to gate G of FET 1 as shown in FIG. 3A so that the gate terminal is seen as being open in a given frequency band by a gate bias circuit, and an equivalent circuit of FET 1 is expressed as a two-terminal circuit model. The two-terminal circuit model has source-drain capacitance 5 and current source 6 connected parallel to each other. Current source 6 is a device whose current varies depending on the voltage.

In the two-terminal nonlinear FET model, current source 6 can be expressed by the following equations (1)–(4) using a hyperbolic function, with drain current Ids represented as a function of source-drain voltage Vds. Specifically, when the FET is in an open-channel state, drain current $Ids_0$ and gate current $Ig_0$ thereof are expressed as follows:

$$Ids_o = \begin{cases} \beta(-R_{Iso}Ig_o + \phi_B - V_T)^2\tanh(\alpha Vds), & Vds \leq -\phi_B \\ \beta(Vgs_o - Vds - V_T)^2\tanh(\alpha Vds), & -\phi_B \leq Vds \leq 0 \\ \beta(Vgs_o - V_T)^2\tanh(\gamma Vds), & 0 \leq Vds \end{cases} \quad (1)$$

$$Ig_o = \begin{cases} 0, & -\phi_B \leq Vds \\ I_{SG}(\exp(\kappa_f(Vgs_o - Vds - \phi_B)] - 1\}, & Vds \leq -\phi_B \end{cases} \quad (2)$$

When the FET is in a pinch-off state, drain current $Ids_p$ and gate current $Ig_p$ thereof are expressed as follows:

$$Ids_p = \qquad\qquad (3)$$
$$\begin{cases} \beta(-R_{Iso}Ig_p + \phi_B - V_T)^2\tanh(\alpha Vds), & Vds \leq Vgs_p - \phi_B \\ \beta(Vgs_p - Vds - V_T)^2\tanh(\alpha Vds), & Vgs_p - \phi_B \leq Vds \leq Vgs_p - V_T \\ 0, & Vgs_p - V_T \leq Vds \leq V_B \\ I_{SD}\{\exp[\kappa_r(Vds - V_B)] - 1\}, & V_B \leq Vds \end{cases}$$

$$Ig_p = \begin{cases} 0, & Vgs_p - \phi_B \leq Vds \\ I_{SG}(\exp[\kappa_f(Vgs_p - Vds - \phi_B)] - 1\}, & Vds \leq Vgs_p - \phi_B \end{cases} \quad (4)$$

where $\phi_B$ represents the built-in voltage, $V_T$ the threshold voltage, $Vgs_0$ the gate bias in the open-channel state, $Vgs_p$ the gate bias in the pinch-off state, $\alpha$ the drain voltage scaling factor when Vds is negative, $\beta$ the transconductance parameter, $\gamma$ the drain voltage scaling factor when Vds is positive, $V_B$ the drain breakdown voltage, $IS_D$, $IS_G$ drain and gate saturation current parameters, $\kappa_r$, $\kappa_f$ the voltage scaling factors, and $R_{Iso}$ the gate isolation resistance. Though drain current Ids has been expressed using the hyperbolic function with respect to Vds above, drain current Ids may be expressed using another function such as a cubic function or a polynomial function of higher degree, for example.

A method of determining device parameters of a circuit using the two-terminal nonlinear FET model will be described below. Specifically, a method of determining device parameters using an AlGaAs heterojunction FET having a gate length of 0.15 μm and a gate width of 100 μm based on the two-terminal nonlinear FET model shown in FIG. 4 will be described below. The parameters of capacitance 5 and current source 6 of the FET are determined independently of each other.

(1) The Capacitance of the FET

Figure 5:
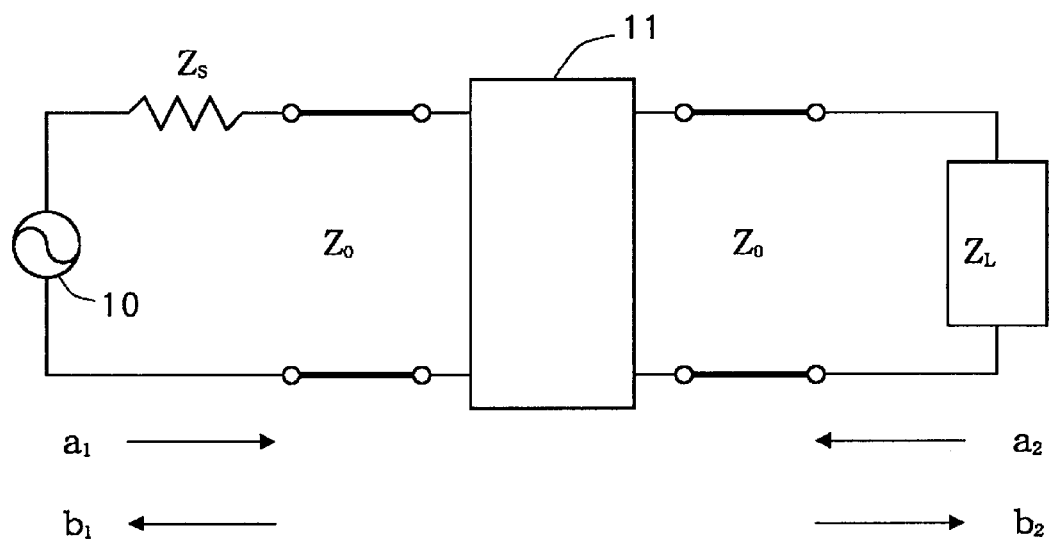
FIG. 5 is a block diagram showing a circuit for measuring small signal S parameters with a network analyzer.

For determining the capacitance of the FET, source S and drain G of FET 1 shown in FIG. 3A are connected respective to input and output terminals of a network analyzer to measure small signal S parameters. FIG. 5 schematically shows a circuit for measuring small signal S parameters with a network analyzer.

In the measuring circuit shown in FIG. 5, the network analyzer has signal source 10, impedance $Z_S$ of signal source 10, and load $Z_L$. Input powers $|a_1|^2$, $|a_2|^2$ are applied from these components to evaluating sample 11, where $a_1$, $a_2$ represent normalized voltage amplitudes of the incident waves which may be sine waves, for example. A signal level in the measurement of small signal S parameters is −20 dBm, for example, which corresponds to the small signal described above.

The applied voltages $a_1$, $a_2$ and reflected voltages $b_1$, $b_2$ are related to each other by the following equations:

$$b_1 = S_{11}a_1 + S_{12}a_2$$

$$b_2 = S_{21}a_1 + S_{22}a_2$$

where $S_{rf}$ is referred to as a "scattering parameter" or "S parameter". If load $Z_L$ of the network analyzer is $Z_L = Z_0$, then reflected voltage $b_2$ is absorbed by load $Z_L$, and reflected voltage $a_2$ from load $Z_L$ is nil. At this time, the scattering parameters are expressed as follows:

$$S_{11} = b_1/a_1$$

$$S_{21} = b_2/a_1$$

If impedance $Z_S$ of signal source 10 is $Z_S = Z_0$, then reflected voltage $b_1$ is absorbed by signal source 10, and reflected voltage a1 from the signal source is nil. At this time, the scattering parameters are expressed as follows:

$$S_{22} = b_2/a_2$$

$$S_{12} = b_1/a_2$$

In the manner described above, small signal S parameters can be measured using the network analyzer.

Small signal S parameters are measured using the network analyzer with the gate bias of 0 V when the FET is in the open-channel state and with the gate bias of −5 V when the FET is in the pinch-off state. When the FET is in the pinch-off state, the gate bias is not limited to −5 V, but may be of any value lower than the pinch-off voltage and higher than the gate breakdown voltage.

Figure 3C:
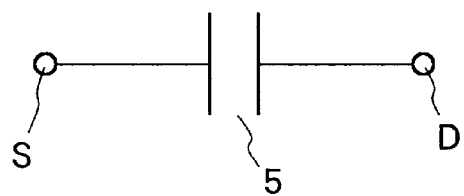
FIG. 3C is a circuit diagram of an equivalent circuit of a two-terminal FET model in a pinch-off state while being operated with a small signal.

With respect to scattering parameter $S_{11}$ or $S_{21}$, of the measured small signal S parameters of the FET, the value of capacitance 5 is determined such that the value calculated using capacitance 5 in the circuit shown in FIG. 3C as a parameter is equalized to the actually measured value. In this manner, the capacitance of the FET is determined. However, the capacitance of the FET may comprise an empirical value obtained from data of prototypes in the past.

(2) The Parameters of the Current Source

For determining the parameters of the current source, drain current Ids of the FET shown in FIG. 3A is measured as static characteristics of the FET, i.e., current-voltage characteristics Ids–Vds, Ids–Vgs, with gate-source voltage Vgs and drain-source voltage Vds used as parameters, by a known semiconductor parameter analyzer. In the measurement, the source of the FET is grounded, and the applied drain voltage varied from −10 V to 15 V. The drain voltage is measured from a value lower than $(Vgs_p-V_T)$ to a value greater than $V_B$. The drain of the FET may be grounded, and if the drain of the FET is grounded, the suffixes "s" and "d" in the equations (1)–(4) need to be switched around.

Figure 6:
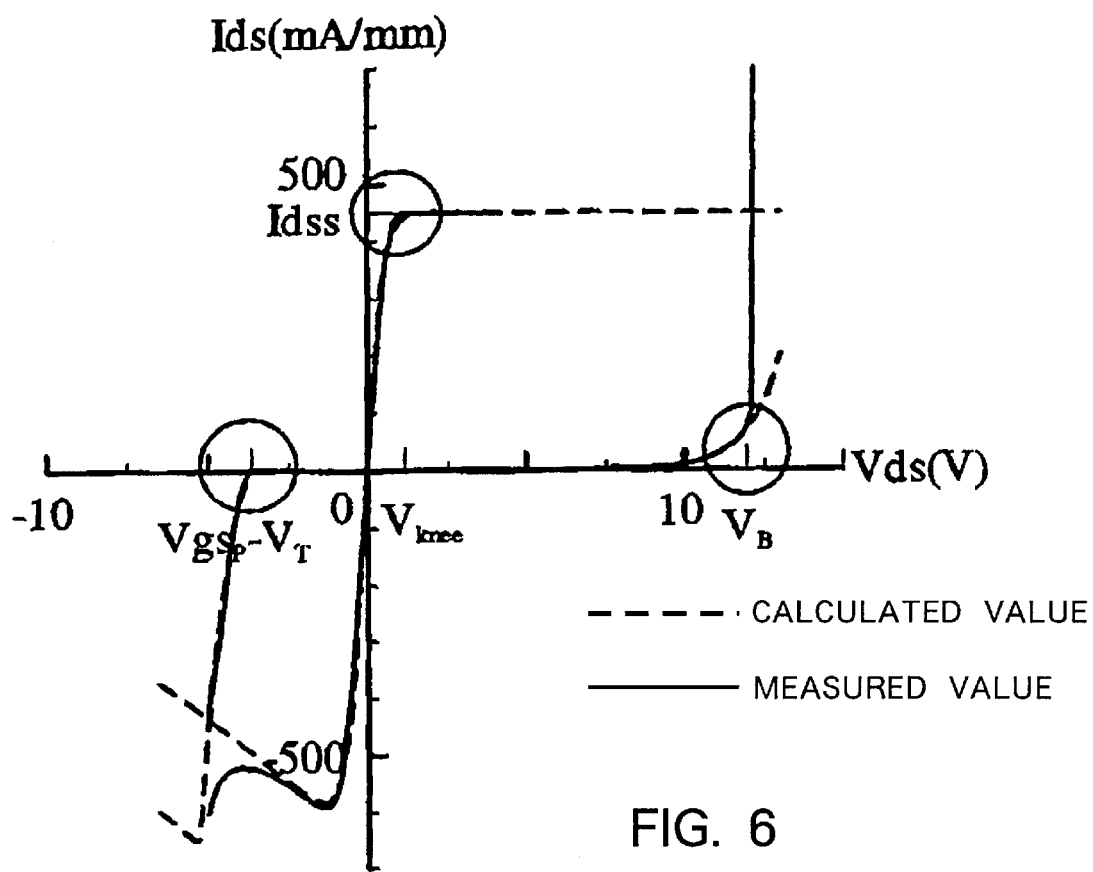
FIG. 6 is a graph showing current-voltage characteristics of a current source shown in FIG. 4.

With respect to the current-voltage characteristics Ids–Vds, Ids–Vgs of the FET measured by the semiconductor parameter analyzer, the parameters of current source 6 are determined using the equivalent circuit shown in FIG. 4 such that values calculated according to the equations (1)–(4) representing current source 6 are equalized to the actually measured values. FIG. 6 shows the actually measured values of current-voltage characteristics Ids–Vds (solid-line curve) and the calculated values thereof after the parameters are determined.

As can be seen from FIG. 6, the equations (1)–(4) representing the current source 6 are very well in accord with the actually measured values, indicating that the equations (1)–(4) are justified. A list of parameters of the two-terminal nonlinear FET thus determined is given in Table 2 below. Here, capacitance C is 20 fF.

TABLE 2

| | |
|---|---|
| ØR | 0.31 V |
| α | 2.0 V$^{-1}$ |
| β | 0.02 A/V$^2$ |
| γ | 1.5 V$^{-1}$ |
| κf | 0.01 V$^{-1}$ |
| κr | 1.0 V$^{-1}$ |
| $V_T$ | −1.5 V |
| $R_{ISO}$ | 100 kΩ |
| $Is_G$ | 0.00007 A |
| $Is_D$ | 0.1 A |
| $V_B$ | 7.3 V |
| $Vgs_o$ | 0 V |
| $Vgs_p$ | −5.0 V |

After the parameters of the two-terminal nonlinear FET model have been determined as described above, a large-signal FET circuit may be designed using the two-terminal nonlinear FET model. In deigning such a large-signal FET circuit, a known circuit simulator may be used, and the FET in the circuit may be described with the above parameters.

Figure 7:
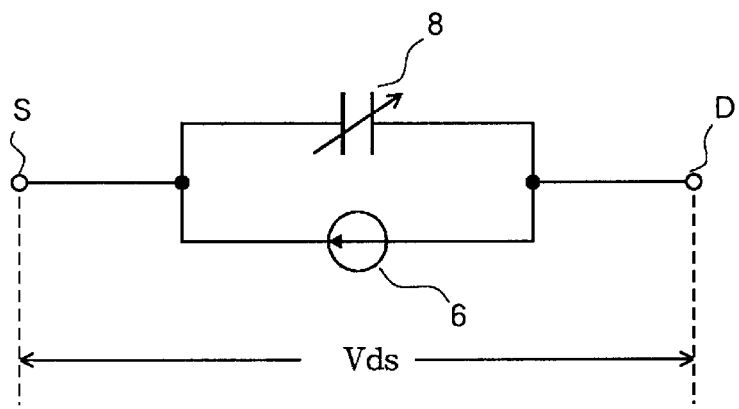
FIG. 7 is a circuit diagram of an equivalent circuit of a modified two-terminal nonlinear FET model according to the first embodiment.

FIG. 7 shows an equivalent circuit of a modified two-terminal nonlinear FET model. As shown in FIG. 7, the equivalent circuit comprises a parallel-connected circuit of voltage-dependent capacitance 8 and current source 6.

Figure 8A:
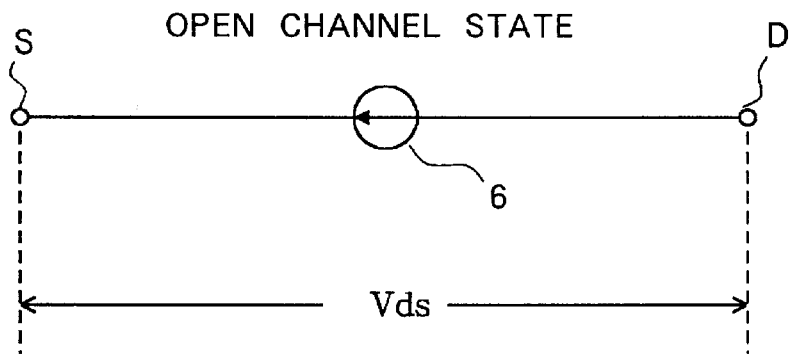
FIG. 8A is a circuit diagram of an equivalent circuit of a two-terminal nonlinear FET model in an open-channel state according to a second embodiment of the present invention.
Figure 8B:
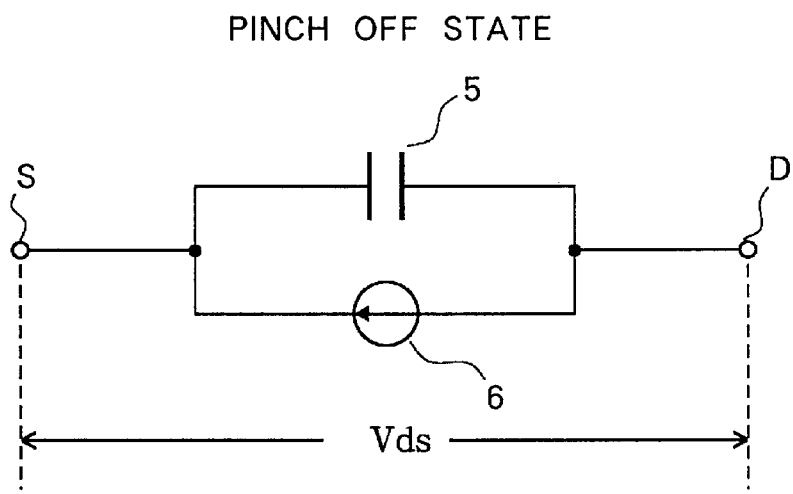
FIG. 8B is a circuit diagram of an equivalent circuit of the two-terminal nonlinear FET model in a pinch-off state according to the second embodiment of the present invention.

A two-terminal nonlinear FET model according to a second embodiment of the present invention will be described below. When the FET is in an open-channel state, the two-terminal nonlinear FET model is expressed as two-terminal current source 6 as shown in FIG. 8A, and when the FET is in a pinch-off state, the two-terminal nonlinear FET model is expressed as a two-terminal circuit comprising capacitance 5 and current source 6 connected parallel to each other as shown in FIG. 8B. Parameters of the two-terminal nonlinear FET model according to the second embodiment are determined in the same manner as with the first embodiment. The two-terminal model according to the first embodiment shown in FIG. 4 and the two-terminal model according to the second embodiment shown in FIGS. 8A and 8B differ from each other as to whether capacitance 5 is to be taken into account when the FET is in the open-channel state or not.

Equivalent circuits of a switch circuit shown in FIG. 9A when the switch circuit is in an on state and an off state will be described below.

Figure 9A:
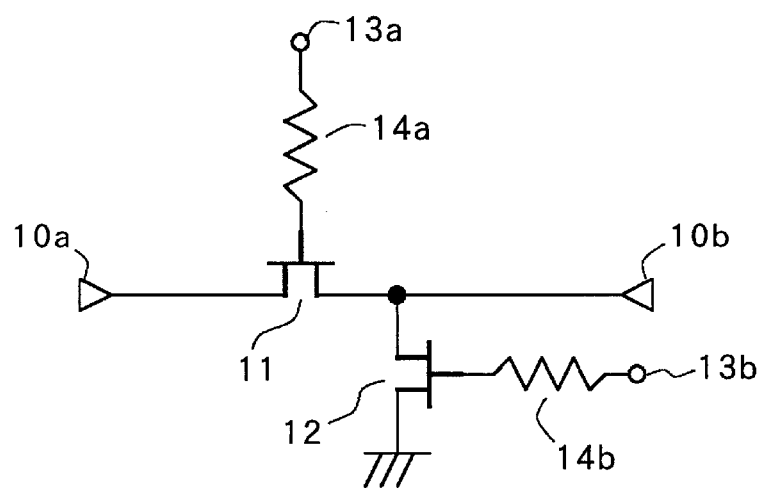
FIG. 9A is a circuit diagram of a switch circuit with FETs.

The switch circuit shown in FIG. 9A comprises FET 11 having a source connected to input/output terminal 10a and a gate connected to terminal 13a via isolation resistor 14a, and FET 12 having a source grounded and a gate connected to terminal 13b via isolation resistor 14b, FETs 11, 12 have respective drains connected to input/output terminal 10b.

Gate control voltages are applied respectively to terminals 13a, 13b. Each of FETs 11, 12 comprises an AlGaAs heterojunction FET having a gate length of 0.15 μm and a gate width of 100 μm. The switch circuit is constructed as a microwave monolithic integrated circuit (MMIC).

Figure 9B:
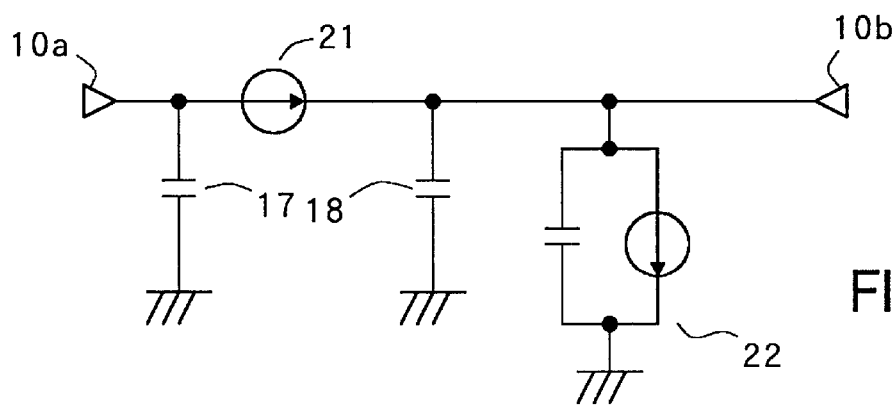
FIG. 9B is a circuit diagram of an equivalent circuit of the FETs in an open-channel state of the switch circuit shown in FIG. 9A.

The equivalent circuit of the switch circuit when it is in the on-state is shown in FIG. 9B. As shown in FIG. 9B, two-terminal current source 21 which is an equivalent circuit of FET 11 in the open-channel state is connected in series between input/output terminals 10a, 10b, and two-terminal parallel-connected circuit 22 comprising a capacitance and a current source which are an equivalent circuit of FET 12 in the pinch-off state is connected parallel between input/output terminals 10a, 10b. In FIG. 9B, parasitic capacitances 17, 18 represent parasitic capacitances due to source and drain electrodes to be taken into account in a prototype microwave monolithic integrated circuit.

Figure 9C:
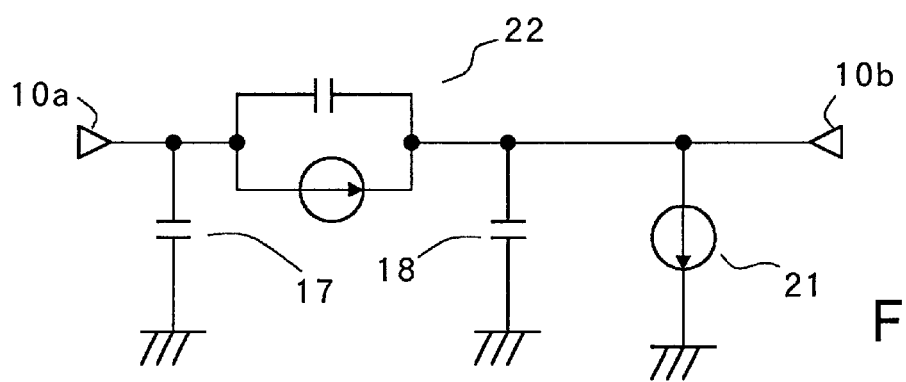
FIG. 9C is a circuit diagram of an equivalent circuit of the FETs in a pinch-off state of the switch circuit shown in FIG. 9A.

The equivalent circuit of the switch circuit when it is in the off-state is shown in FIG. 9C. As shown in FIG. 9C, two-terminal current source 21 which is an equivalent circuit of FET 11 in the open-channel state and two-terminal parallel-connected circuit 22 which is an equivalent circuit of FET 12 in the pinch-off state when the switch circuit is in the on state are switched around.

If it is assumed that the parameters of the two-terminal model have already been determined by the method according to the first embodiment, then operation of the switch circuit with respect to an inputted large signal can be simulated with high accuracy by using the determined parameters. Therefore, a large-signal circuit can be designed by using the parameters of the two-terminal model.

Figure 10:
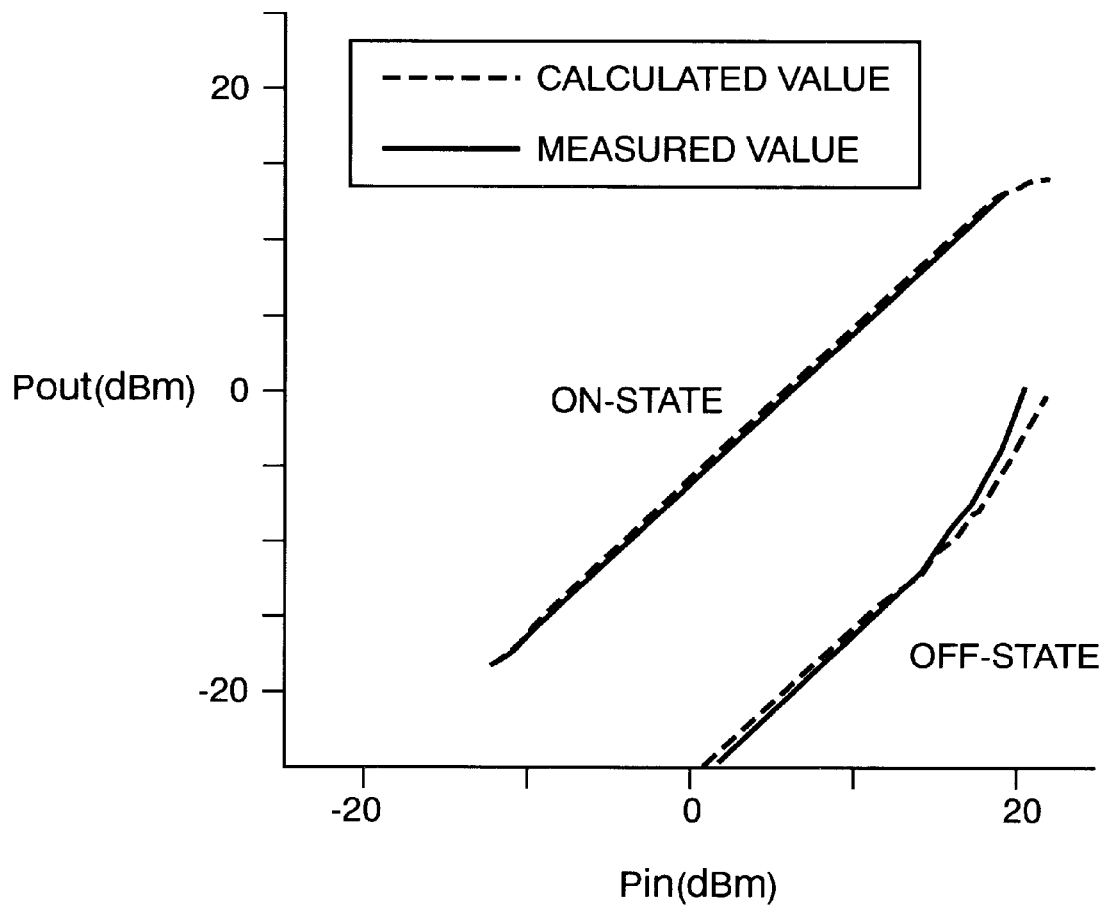
FIG. 10 is a diagram showing power transmittance characteristics achieved when the circuit shown in FIGS. 9A, 9B, and 9C is employed.

Based on the equivalent circuits shown in FIGS. 9B and 9C, power input/output characteristics at 40 GHz of the switch circuit were simulated using a known harmonic balance process. As a result, broken-line curves were plotted as shown in FIG. 10. Measured power transmittance characteristics of an actually constructed MMIC were plotted as solid-line curves in FIG. 10. The measured values and the simulated values are very well in accord with each other, indicating that the method of designing a circuit using a two-terminal nonlinear FET model according to the present invention is justified.

While preferred embodiments of the present invention have been described using specific terms, such description is for illustrative purposes only, and it is to be understood that changes and variations may be made without departing from the spirit or scope of the following claims.

What is claimed is:

1. A method of designing a circuit with a field effect transistor, comprising the steps of:
   expressing the field effect transistor with a two-terminal nonlinear circuit model having a source and a drain, such that a gate terminal thereof is open in at least a frequency band used thereby; and calculating behaviors of the circuit in operation with a large signal represented by a large amplitude of an input voltage, based on said two-terminal nonlinear circuit model.

2. A method according to claim 1, wherein said two-terminal nonlinear circuit model comprises a two-terminal circuit model having a current source whose current varies depending on a voltage and a source-drain capacitance connected parallel to said current source.

3. A method according to claim 2, wherein the current of said current source is variable depending on a source-drain voltage of said field effect transistor.

4. A method according to claim 2, wherein said source-drain capacitance is variable depending on a source-drain voltage of said field effect transistor.

5. A method according to claim 1, wherein said two-terminal nonlinear circuit model comprises a circuit model having a current source whose current varies depending on a voltage and a source-drain capacitance connected parallel to said current source when said field effect transistor is in a pinch-off state, and a circuit model having only said current source when said field effect transistor is in an open-channel state.

6. A method according to claim 5, wherein the current of said current source is variable depending on a source-drain voltage of said field effect transistor.

7. A method of designing a circuit with a field effect transistor, comprising the steps of:
    expressing the field effect transistor with a two-terminal nonlinear circuit model having a source and a drain, such that a gate terminal thereof is open in at least a frequency band used thereby; and
    calculating behaviors of the circuit in operation with a large signal represented by a large amplitude of an input voltage, based on said two-terminal nonlinear circuit model;

wherein said two-terminal nonlinear circuit model comprises a two-terminal circuit model having a current source whose current varies depending on a voltage and a source-drain capacitance connected in parallel to said current source;

wherein the current of said current source is variable depending on a source-drain voltage of said field effect transistor;

wherein when the field effect transistor is in the open-channel state, drain current $Ids_0$ and gate current $Ig_0$ of said current source are expressed as follows:

$$Ids_0 = \begin{cases} \beta(-R_{Iso}Ig_o + \phi_B - V_T)^2\tanh(\alpha Vds), & Vds \leq -\phi_B \\ \beta(Vgs_o - Vds - V_T)^2\tanh(\alpha Vds), & -\phi_B \leq Vds \leq 0 \\ \beta(Vgs_o - V_T)^2\tanh(\gamma Vds), & 0 \leq Vds \end{cases} \quad (1)$$

$$Ig_0 = \begin{cases} 0, & -\phi_B \leq Vds \\ Is_G(\exp[\kappa_f(Vgs_o - Vds - \phi_B)] - 1), & Vds \leq -\phi_B \end{cases} \quad (2)$$

and when the field effect transistor is in the pinch-off state, drain current $Ids_p$ and gate current $Ig_p$ are expressed as follows:

$$Ids_p = \begin{cases} \beta(-R_{Iso}Ig_p + \phi_B - V_T)^2\tanh(\alpha Vds), & Vds \leq Vgs_p - \phi_B \\ \beta(Vgs_p - Vds - V_T)^2\tanh(\alpha Vds), & Vgs_p - \phi_B \leq Vds \leq Vgs_p - V_T \\ 0, & Vgs_p - V_T \leq Vds \leq V_B \\ Is_D\{\exp[\kappa_r(Vds - V_B)] - 1\}, & V_B \leq Vds \end{cases} \quad (3)$$

$$Ig_p = \begin{cases} 0, & Vgs_p - \phi_B \leq Vds \\ Is_G(\exp[\kappa_f(Vgs_p - Vds - \phi_B)] - 1), & Vds \leq Vgs_p - \phi_B \end{cases} \quad (4)$$

where Vds represents a source-drain voltage, $N_B$ a built-in voltage, $V_T$ a threshold voltage, $Vgs_0$ a gate bias in the open-channel state, $Vgs_p$ a gate bias in the pinch-off state, ∀ a drain voltage scaling factor when Vds is negative, ∃ a transconductance parameter, (a drain voltage scaling factor when Vds is positive, $V_B$ a drain breakdown voltage, $IS_D$, $IS_G$ drain and gate saturation current parameters, $6_r$', $6_f$ voltage scaling factors, and $R_{Iso}$, a gate isolation resistance.

8. A method of determining parameters of a two-terminal nonlinear circuit model having a source and a drain and representing a field effect transistor such that a gate terminal thereof is open in at least a frequency band used thereby, comprising the steps of:
    employing, as said two-terminal nonlinear circuit model, a two-terminal circuit model comprising a current source whose current varies depending on a voltage and a source-drain capacitance connected in parallel to said current source;
    expressing drain currents and gate currents and gate currents when the field effect transistor is in an open-channel state and a pinch-off state, using a function of a source-drain voltage or a predetermined function depending on a range of the source-drain voltage;
    calculating behaviors of the two-terminal nonlinear circuit model in operation with a large signal represented by a large amplitude of an input voltage; and
    measuring electrical parameters on a field effect transistor and determining parameters of said equations based on measured values.

9. A method according to claim 8, further comprising the steps of:
    independently determining parameters related to said source-drain capacitance by fitting small signal parameters measured in operation with a small signal represented by a small amplitude of an input voltage which is determined by an impedance and an input voltage of a circuit with said field effect transistor; and
    independently determining parameters related to said current source by fitting measured values of current-voltage characteristics of said field-effect transistor.

10. A method according to claim 8, wherein said source-drain capacitance is variable depending on the source-drain voltage.

11. A method of determining parameters of a two-terminal nonlinear circuit model having a source and a drain and representing a field effect transistor such that a gate terminal thereof is open in at least a frequency band used thereby, comprising the steps of:
    employing, as said two-terminal nonlinear circuit model, a two-terminal circuit model comprising a current source whose current varies depending on a voltage and a source-drain capacitance connected in parallel to said current source;
    expressing drain currents and gate currents when the field effect transistor is in an open-channel state and a pinch-off state, with equations using a function of a source-drain voltage or a predetermined function depending on a range of the source-drain voltage; and measuring electrical parameters on a field effect transistor and determining parameters of said equations based on measured values;

further comprising the steps of:

independently determining parameters related to said source-drain capacitance by fitting small signal parameters measured in operation with a small signal represented by a small amplitude of an input voltage which is determined by an impedance and an input voltage of a circuit with said field effect transistor; and independently determining parameters related to said current source by fitting measured values of current-voltage characteristics of said field-effect transistor;

wherein when the field-effect transistor is in the open-channel state, drain current $Ids_0$ and gate current $Ig_0$ are expressed as follows:

$$Ids_0 = \begin{cases} \beta(-R_{Iso}Ig_o + \phi_B - V_T)^2\tanh(\alpha Vds), & Vds \leq -\phi_B \\ \beta(Vgs_o - Vds - V_T)^2\tanh(\alpha Vds), & -\phi_B \leq Vds \leq 0 \\ \beta(Vgs_o - V_T)^2\tanh(\gamma Vds), & 0 \leq Vds \end{cases} \quad (1)$$

$$Ig_0 = \begin{cases} 0, & -\phi_B \leq Vds \\ Is_G(\exp[\kappa_f(Vgs_o - Vds - \phi_B)] - 1), & Vds \leq -\phi_B \end{cases} \quad (2)$$

and when the field effect transistor is in the pinch-off state, drain current $Ids_p$ and gate current $Ig_p$ are expressed as follows:

$$Ids_p = \quad (3)$$

$$\begin{cases} \beta(-R_{Iso}Ig_p + \phi_B - V_T)^2\tanh(\alpha Vds), & Vds \leq Vgs_p - \phi_B \\ \beta(Vgs_p - Vds - V_T)^2\tanh(\alpha Vds), & Vgs_p - \phi_B \leq Vds \leq Vgs_p - V_T \\ 0, & Vgs_p - V_T \leq Vds \leq V_B \\ Is_D\{\exp[\kappa_r(Vds - V_B)] - 1\}, & V_B \leq Vds \end{cases}$$

$$Ig_p = \begin{cases} 0, & Vgs_p - \phi_B \leq Vds \\ Is_G(\exp[\kappa_f(Vgs_p - Vds - \phi_B)] - 1), & Vds \leq Vgs_p - \phi_B \end{cases} \quad (4)$$

where Vds represents a source-drain voltage, $N_B$ a built-in voltage, $V_T$ a threshold voltage, $Vgs_0$ a gate bias in the open-channel state, $Vgs_p$ a gate bias in the pinch-off state, $\forall$ a drain voltage scaling factor when Vds is negative, $\exists$ a transconductance parameter, (a drain voltage scaling factor when Vds is positive, $V_B$ a drain breakdown voltage, $Is_D$, $IS_G$ drain and gate saturation current parameters, Kr', Kf voltage scaling factors, and $P_{Iso}$ a gate isolation resistance, and the parameters related to said current sources are determined on the basis of the above equations.

12. A method of determining parameters of a two-terminal nonlinear circuit model having a source and a drain and representing a field effect transistor such that a gate terminal thereof is open in at least a frequency band used thereby, comprising the steps of:

employing, as said two-terminal nonlinear circuit model, a two-terminal circuit model comprising a circuit having a current source whose current varies depending on a voltage and a source-drain capacitance connected in parallel to said current source when said field effect transistor is in a pinch-off state, and a circuit having only said current source when said field-effect transistor is in an open-channel slate;

expressing drain currents and gate currents when the field-effect transistor is in the open-channel state and the pinch-off state, using a function of a source-drain voltage or a predetermined function depending on a range of the source-drain voltage;

calculating behaviors of the two-terminal nonlinear circuit model in operation with a large signal represented by a large amplitude of an input voltage; and measuring electrical parameters on a field effect transistor and determining parameters of said equations based on measured values.

13. A method according to claim 12, further comprising the steps of:

independently determining parameters related to said source-drain capacitance by fitting small signal parameters measured in operation with a small signal represented by a small amplitude of an input voltage which is determined by an impedance and an input voltage of a circuit with said field-effect transistor; and independently determining parameters related to said current source by fitting measured values of current-voltage characteristics of said field effect transistor.

* * * * *